(12) United States Patent
Jeon et al.

(10) Patent No.: US 10,128,425 B2
(45) Date of Patent: *Nov. 13, 2018

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Joon Woo Jeon, Seoul (KR); Sang Seok Lee, Seoul (KR); Hyun Kwon Hong, Cheonan-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/863,724

(22) Filed: Jan. 5, 2018

(65) Prior Publication Data

US 2018/0130932 A1    May 10, 2018

Related U.S. Application Data

(63) Continuation of application No. 15/443,202, filed on Feb. 27, 2017, now Pat. No. 9,887,334.

(30) Foreign Application Priority Data

Aug. 3, 2016    (KR) .......................... 10/2016/0098829

(51) Int. Cl.
*H01L 33/62*      (2010.01)
*H01L 33/24*      (2010.01)
(Continued)

(52) U.S. Cl.
CPC .............. *H01L 33/62* (2013.01); *H01L 33/24* (2013.01); *H01L 33/38* (2013.01); *H01L 33/44* (2013.01);
(Continued)

(58) Field of Classification Search
CPC ......... H01L 33/62; H01L 33/24; H01L 33/38; H01L 33/44; H01L 2933/0066; H01L 2933/0016; H01L 2933/0025
See application file for complete search history.

(56) References Cited

U.S. PATENT DOCUMENTS 6,372,608 B1    4/2002   Shimoda et al.
6,645,830 B2    11/2003  Shimoda et al.
(Continued)

FOREIGN PATENT DOCUMENTS

JP    2013-048200 A    3/2013
JP    2014-022609 A    2/2014
(Continued)

*Primary Examiner* — Kyoung Lee
(74) *Attorney, Agent, or Firm* — Lee & Morse, P.C.

(57) ABSTRACT

A semiconductor light emitting device includes a light emitting structure including a first conductivity-type semiconductor layer, an active layer, and a second conductivity-type semiconductor layer; and an insulating layer on the light emitting structure and including first and second through-holes. The insulating layer includes a first lower insulating layer and a second lower insulating layer. The first insulating layer is disposed on the first conductivity-type semiconductor layer and is surrounded by the second lower insulating layer with the first through-hole interposed therebetween.

20 Claims, 19 Drawing Sheets

(51) Int. Cl.
  *H01L 33/38* (2010.01)
  *H01L 33/44* (2010.01)
(52) U.S. Cl.
  CPC ............... *H01L 2933/0016* (2013.01); *H01L 2933/0025* (2013.01); *H01L 2933/0066* (2013.01)

(56) References Cited

U.S. PATENT DOCUMENTS

| | | | |
|---|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,119,372 B2 | 10/2006 | Stokes et al. |
| 7,154,124 B2 | 12/2006 | Han et al. |
| 7,166,483 B2 | 1/2007 | Liu et al. |
| 7,208,725 B2 | 4/2007 | Sherrer et al. |
| 7,288,758 B2 | 10/2007 | Sherrer et al. |
| 7,291,865 B2 | 11/2007 | Kojima et al. |
| 7,319,044 B2 | 1/2008 | Han et al. |
| 7,375,380 B2 | 5/2008 | Asahara et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,368,100 B2 | 2/2013 | Donofrio et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,637,886 B2 | 1/2014 | Tsuji |
| 8,735,931 B2 | 5/2014 | Han et al. |
| 8,766,295 B2 | 7/2014 | Kim |
| 8,772,804 B2 | 7/2014 | Ahlstedt et al. |
| 8,823,031 B2 | 9/2014 | Kususe et al. |
| 9,887,334 B1 * | 2/2018 | Jeon .................. H01L 33/24 |
| 2008/0173885 A1 | 7/2008 | Kuromizu |
| 2013/0069095 A1 | 3/2013 | Hodota |
| 2013/0328097 A1 | 12/2013 | Nakada et al. |
| 2014/0284646 A1 | 9/2014 | Kim et al. |
| 2015/0171298 A1 | 6/2015 | Cho et al. |
| 2015/0364665 A1 | 12/2015 | Lopez |
| 2016/0087149 A1 | 3/2016 | Miyachi et al. |

FOREIGN PATENT DOCUMENTS

| | | |
|---|---|---|
| JP | 2014-022610 A | 2/2014 |
| JP | 2016-012744 A | 1/2016 |
| KR | 10-2005-0060171 A | 6/2005 |

* cited by examiner

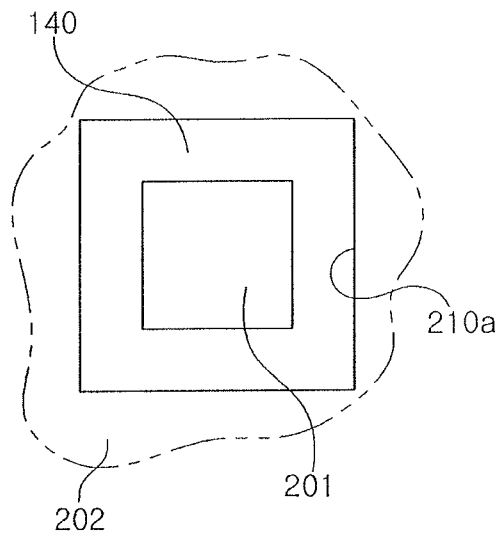
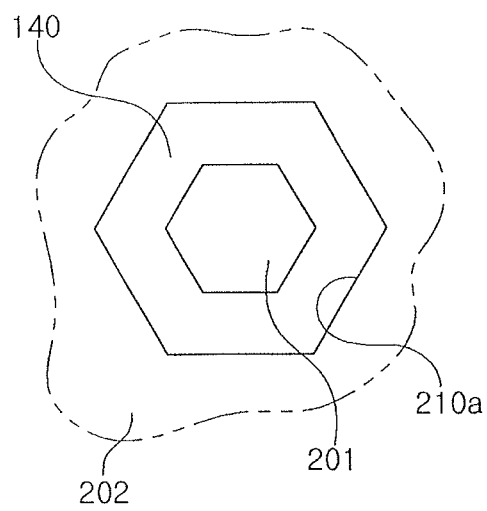
FIG. 4A  FIG. 4B
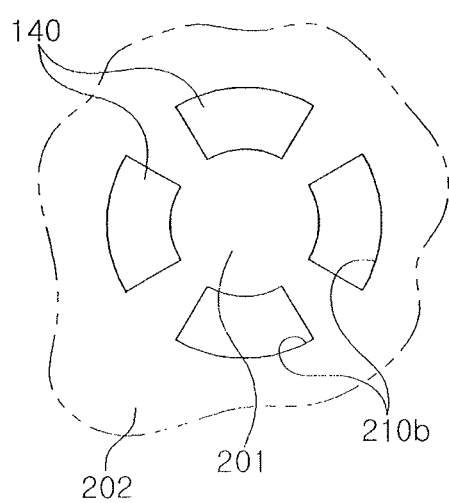
FIG. 4C

SEMICONDUCTOR LIGHT EMITTING DEVICE

CROSS-REFERENCE TO RELATED APPLICATIONS

This is a continuation application based on pending application Ser. No. 15/443,202, filed Feb. 27, 2017, the entire contents of which is hereby incorporated by reference.

Korean Patent Application No. 10-2016-0098829, filed on Aug. 3, 2016, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Flip chip structure light emitting devices that allow light to be emitted in a single direction are useful for implementing high-luminance light emitting elements. In flip chip light emitting devices, metallic electrodes are disposed on P/N semiconductor layers, respectively, to apply power thereto. However, since metallic electrodes absorb, rather than reflect light, light extraction efficiency may be decreased.

SUMMARY

One or more embodiments are directed to a semiconductor light emitting device that includes: a light emitting structure including a first conductivity-type semiconductor layer, an active layer, and a second conductivity-type semiconductor layer; a lower insulating layer on the light emitting structure and including a first through-hole on the first conductivity-type semiconductor layer and a second through-hole on the second conductivity-type semiconductor layer; a connection layer on the lower insulating layer, and electrically connected to the first conductivity-type semiconductor layer and the second conductivity-type semiconductor layer through the first and second through-holes, respectively; and an upper insulating layer on the connection layer and including a third through-hole and a fourth through-hole to partially expose the connection layer. The lower insulating layer includes a first lower insulating layer and a second lower insulating layer partitioned by the first through-hole, and the first lower insulating layer is disposed on the first conductivity-type semiconductor layer and is surrounded by the second lower insulating layer with the first through-hole interposed between the first and second lower insulating layers.

One or more embodiments are directed a semiconductor light emitting device including a light emitting structure including first regions having a first conductivity-type semiconductor layer, an active layer, and a second conductivity-type semiconductor layer stacked on a substrate in a stacking direction, and second regions that expose the first conductivity-type semiconductor layer, adjacent first regions being spaced apart along a second direction, orthogonal to the stacking direction, by a second region; and an insulating layer on the light emitting structure. The insulating layer includes a first through-hole overlapping the first conductivity-type semiconductor layer in the stacking direction in the second region to expose the first conductivity type semiconductor layer and a second through-hole overlapping the second conductivity-type semiconductor layer in the stacking direction in the first region. The first through-hole surrounds a central region in the second region having the lower insulating layer therein.

One or more embodiments are directed a semiconductor light emitting device including a light emitting structure including first regions having a first conductivity-type semiconductor layer, an active layer, and a second conductivity-type semiconductor layer stacked on a substrate in a stacking direction, and second regions that expose the first conductivity-type semiconductor layer, adjacent first regions being spaced apart along a second direction, orthogonal to the stacking direction, by a second region; and an insulating layer on the light emitting structure. The insulating layer includes a first through-hole overlapping the first conductivity-type semiconductor layer in the stacking direction in the second region to expose the first conductivity type semiconductor layer and a second through-hole overlapping the second conductivity-type semiconductor layer in the stacking direction in the first region. The first through-hole surrounds an insulating region having the insulating layer therein within the second region.

BRIEF DESCRIPTION OF THE DRAWINGS

Features will become apparent to those of skill in the art by describing in detail exemplary embodiments with reference to the attached drawings in which:

FIG. 4A to 4C illustrate schematic plan views of first through-holes according to various example embodiments;

DETAILED DESCRIPTION

Hereinafter, example embodiments will be described with reference to the accompanying drawings.

Figure 1:
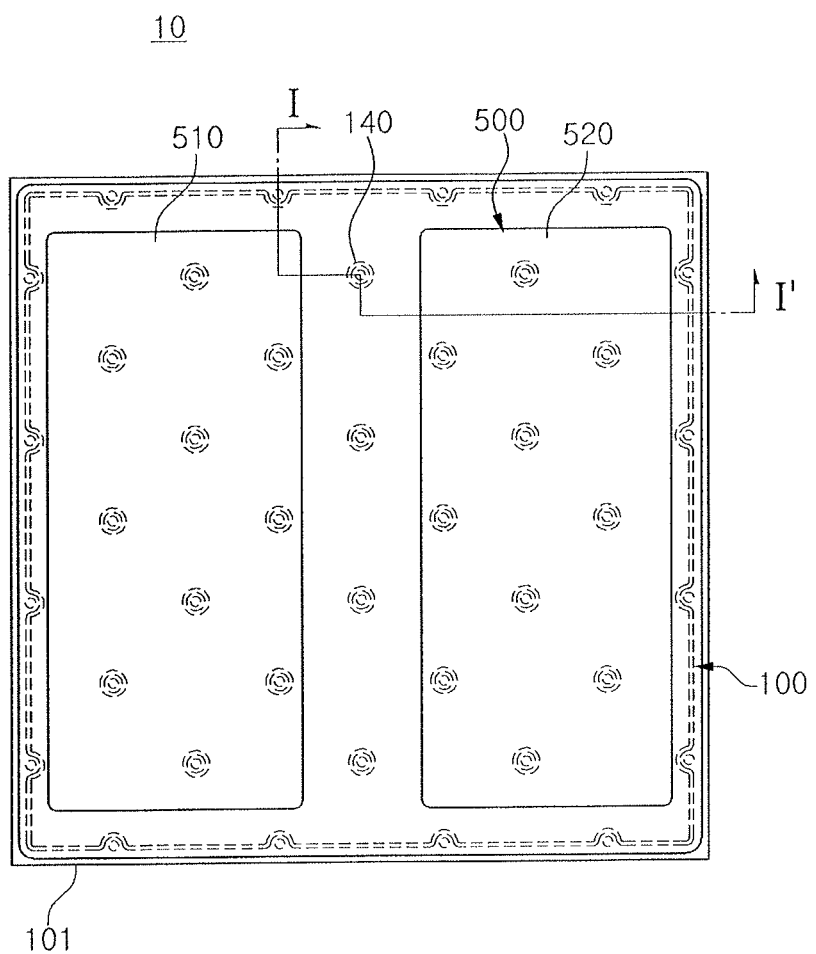
FIG. 1 illustrates a schematic plan view of a semiconductor light emitting device according to an example embodiment.
Figure 2:
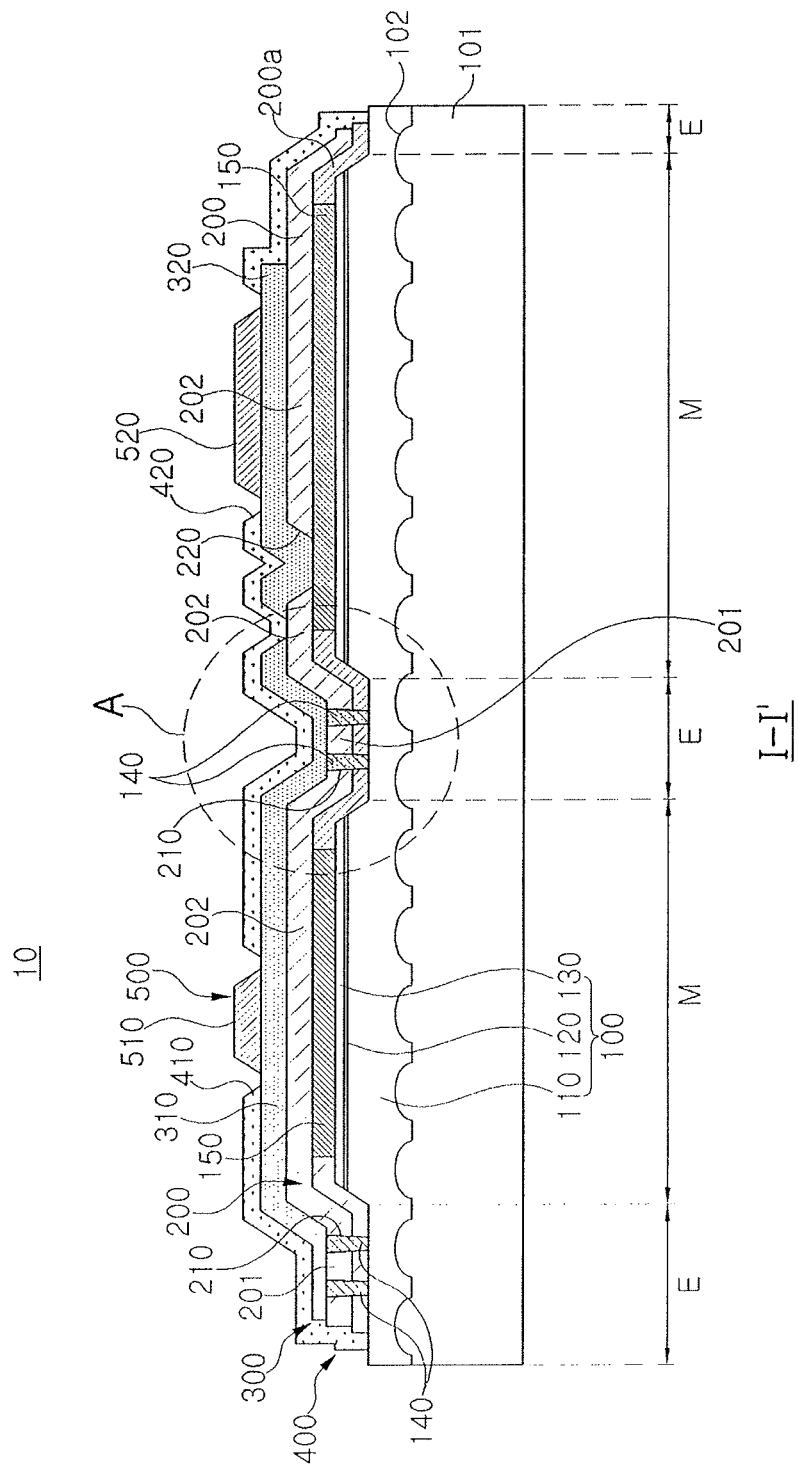
FIG. 2 illustrates a schematic cross-sectional view of the semiconductor light emitting device, taken along line I-I' of FIG. 1.

With reference to FIGS. 1 to 2, a semiconductor light emitting device according to an example embodiment will be described. FIG. 1 is a schematic plan view of a semiconductor light emitting device according to an example embodiment, while FIG. 2 is a schematic cross-sectional view of the semiconductor light emitting device, taken along line I-I' of FIG. 1.

With reference to FIGS. 1 and 2, a semiconductor light emitting device 10 according to an example embodiment may include a light emitting structure 100, a lower insulating layer 200, a connection layer 300, an upper insulating layer 400, and an electrode pad 500.

The light emitting structure 100 may have a structure in which a plurality of semiconductor layers are stacked, and may include a first conductivity-type semiconductor layer 110, an active layer 120, and a second conductivity-type semiconductor layer 130, sequentially stacked on a substrate 101.

The substrate 101 may have an upper surface that extends in x and y directions. The substrate 101 may be provided as a semiconductor growth substrate on which layers are stacked in a z or stacking direction. These layers may be formed using an insulating, conductive, or semiconductor material, e.g., as sapphire ($\alpha$-$Al_2O_3$), silicon (Si), silicon carbide (SiC), magnesium aluminate spinel ($MgAl_2O_4$), magnesium oxide (MgO), lithium aluminate ($LiAlO_2$), lithium gallium oxide ($LiGaO_2$), aluminum nitride (AlN), gallium nitride (GaN), and the like.

Sapphire, widely used as a nitride semiconductor growth substrate, may be a crystal having Hexa-Rhombo R3c symmetry, may have lattice constants of 13.001 Å and 4.758 Å in c-axis and a-axis directions, respectively, and may have a C (0001) plane, an A (1120) plane, an R (1102) plane, and the like. Since the C plane comparatively facilitates the growth of a nitride thin film and is stable at relatively high temperatures, sapphire may be mainly used for a nitride growth substrate.

As illustrated in the drawings, a plurality of concave-convex portions 102 may be formed on an upper surface of the substrate 101, e.g., a growth surface of semiconductor layers. Light emission efficiency and crystalline properties of the semiconductor layers, and the like, may be improved by a structure such as the concave-convex portions 102. The example embodiment illustrates that the concave-convex portions 102 have a dome-shaped convex form, but is not limited thereto. For example, the concave-convex portions 102 may have various shapes, such as a quadrangular shape, a triangular shape, and the like. In addition, the concave-convex portions 102 may be selectively provided or may be omitted.

The substrate 101 as described above may also be later removed in some example embodiments. For example, after the substrate 101 is provided as a growth substrate allowing the first conductivity-type semiconductor layer 110, the active layer 120, and the second conductivity-type semiconductor layer 130 to be grown thereon, the substrate 101 may be removed through a separation or other removal process. The substrate 101 may be separated from the semiconductor layer using a method such as laser lift-off (LLO), chemical lift-off (CLO), or the like.

A buffer layer may further be on the upper surface of the substrate 101. The buffer layer may be provided to reduce a lattice defect of the semiconductor layer grown on the substrate 101, and may be formed of an undoped semiconductor layer formed of a nitride or the like. The buffer layer, for example, may alleviate a difference in lattice constants between the substrate 101 formed of sapphire and the first conductivity-type semiconductor layer 110 formed of GaN and stacked on an upper surface of the substrate 101, to thus increase crystalline properties of a GaN layer. The buffer layer may include an undoped GaN layer, an undoped AlN layer, an undoped indium gallium nitride (InGaN) layer, or the like, applied thereto, and may be grown to have a thickness of tens to hundreds of Å at a relatively low temperature of 500° C. to 600° C. In this case, undoping may indicate a process in which a semiconductor layer is not separately subjected to an impurity doping process, and for example, when a semiconductor layer having an impurity concentration level originally contained therein, a GaN semiconductor is grown using a metal organic chemical vapor deposition (MOCVD) method, Si or the like used as a dopant may be contained therein at a level of about $10^{14}$ to $10^{18}/cm^3$, even unintentionally. However, the buffer layer may also be omitted.

The first conductivity-type semiconductor layer 110 stacked on the substrate 101 may be a semiconductor doped with an n-type impurity, e.g., an n-type nitride semiconductor layer. The second conductivity-type semiconductor layer 130 may be a semiconductor doped with a p-type impurity, e.g., a p-type nitride semiconductor layer. However, according to an example embodiment, the positions of the first and second conductivity-type semiconductor layers 110 and 130 may be changed such that they are disposed in positions opposite to each other. The first and second conductivity-type semiconductor layers 110 and 130 may be represented by an empirical formula $Al_xIn_yGa_{(1-x-y)}N$ ($0 \leq x < 1$, $0 \leq y < 1$, $0 \leq x+y < 1$), e.g., formed using a material such as GaN, aluminum gallium nitride (AlGaN), indium gallium nitride (InGaN), indium gallium aluminum nitride (AlInGaN), or the like.

The active layer 120 between the first and second conductivity-type semiconductor layers 110 and 130 may emit light having a predetermined amount of energy through the recombination of electrons and holes. The active layer 120 may include a material having an energy band gap smaller than that of the first and second conductivity-type semiconductor layers 110 and 130. For example, when the first and second conductivity-type semiconductor layers 110 and 130 are GaN-based compound semiconductors, the active layer 120 may include an InGaN-based compound semiconductor having an energy band gap smaller than that of GaN. In addition, the active layer 120 may have a multiple quantum well (MQW) structure in which quantum well layers and quantum barrier layers are alternately stacked, for example, an InGaN/GaN structure, but is not limited thereto. Thus, the active layer 120 may have a single quantum well (SQW) structure.

The light emitting structure 100 may include etched regions E formed by etching portions of the second conductivity-type semiconductor layer 130, the active layer 120, and the first conductivity-type semiconductor layer 110, and mesa regions M partitioned by the etched regions E, e.g., mesa regions having the second conductivity-type semiconductor layer 130, the active layer 120, and the first conductivity-type semiconductor layer 110, and grooves in the first conductivity-type semiconductor layer 110 that do not include the second conductivity-type semiconductor layer 130 or the active layer 120.

First contact electrodes 140 may be contact a surface of the first conductivity-type semiconductor layer 110 exposed by the etched regions E to thus be connected to the first conductivity-type semiconductor layer 110. A second contact electrode 150 may be on a surface of the second conductivity-type semiconductor layer 130, to thus be connected to the second conductivity-type semiconductor layer 130.

In detail, as illustrated in FIGS. 1 and 2, the first contact electrodes 140 connected to the first conductivity-type semiconductor layer 110 may be arranged in the entirety of the light emitting structure 100 at a predetermined interval therebetween to allow for uniform current injection thereinto.

A passivation layer 200a formed of an insulating material may be provided on lateral surfaces of the mesa regions M to cover the active layer 120 exposed to the etched regions E. The passivation layer 200a may cover bottom surfaces of the etched regions E as well as a portion of the top surface of the mesa regions M. The passivation layer 200a may be selectively provided, and may also be omitted.

The lower insulating layer 200 may have a structure entirely covering the light emitting structure 100, except for contact holes therein, and may be on the light emitting structure 100. The lower insulating layer 200 may be basically formed of a material having insulating properties, and may be formed using an inorganic material or an organic material. For example, the lower insulating layer 200 may be formed of an epoxy-based insulating material. In addition, the lower insulating layer 200 may be formed to include silicon oxide or silicon nitride, e.g., silicon dioxide ($SiO_2$), silicon mononitride (SiN), silicon oxynitride ($SiO_xN_y$), titanium dioxide ($TiO_2$), silicon nitride ($Si_3N_4$), aluminum oxide ($Al_2O_3$), titanium nitride (TiN), aluminum nitride (AlN), zirconium dioxide ($ZrO_2$), titanium aluminum nitride (TiAlN), titanium silicon nitride (TiSiN), or the like.

The lower insulating layer 200 may have a refractive index lower than that of the light emitting structure 100. The lower insulating layer 200 may include a first through-hole 210 on the first conductivity-type semiconductor layer 110, e.g., overlapping the first conductivity-type semiconductor layer 110 in the etched region E along the third direction, and a second through-hole 220 on the second conductivity-type semiconductor layer 130, e.g., overlapping the second conductivity-type semiconductor layer 130 in the mesa region M along the third direction.

The first through-hole 210 may extend through the etched region E to expose the first conductivity-type semiconductor layer 110. The first through-hole 210 may be formed by partially removing the lower insulating layer 200 from the bottom of the etched region E. The first contact electrode 140, connected to the first conductivity-type semiconductor layer 110, may be disposed within the first through-hole 210 and may fill the first through-hole 210 in the etched region E. The first through-hole 210 may expose the first contact electrode 140 while being embedded in the lower insulating layer 200.

The second through-hole 220 may partially expose the second contact electrode 150 connected to the second conductivity-type semiconductor layer 130 on the second conductivity-type semiconductor layer 130.

Figure 3A:
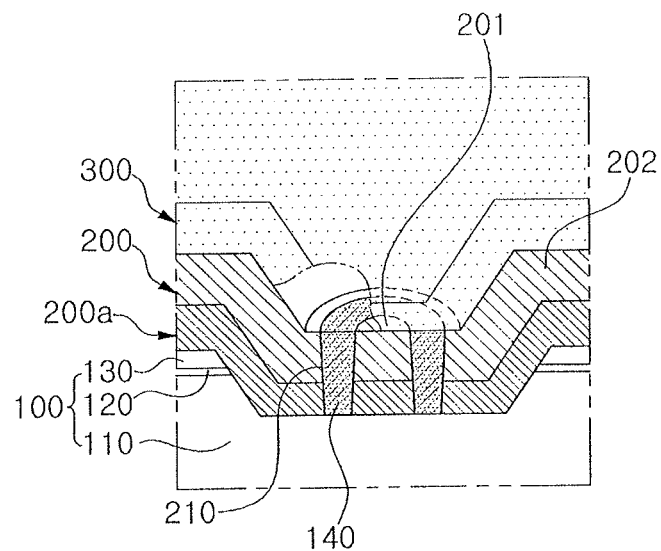
FIG. 3A illustrates a cutaway cross-sectional view schematically of portion A of FIG. 2.
Figure 3B:
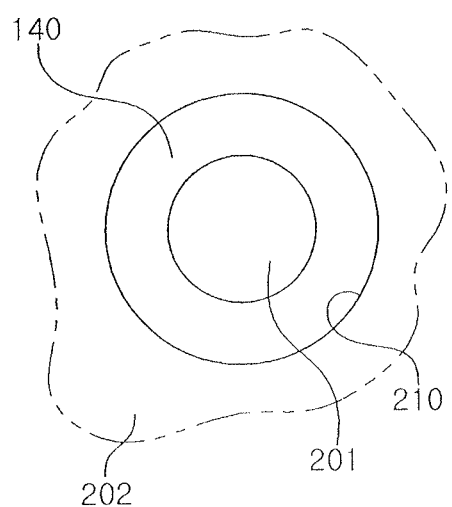
FIG. 3B illustrates a schematic plan view of FIG. 3A.

FIG. 3A is a cutaway cross-sectional view schematically illustrating portion A of FIG. 2, while FIG. 3B is a schematic plan view of FIG. 3A. With reference to FIGS. 3A and 3B, the first through-hole 210 may have a continuous ring-shaped structure, and may penetrate through the lower insulating layer 200 and may be extended to the first conductivity-type semiconductor layer 110. Thus, the first contact electrode 140 may have a ring-shaped structure corresponding to a shape of the first through-hole 210. The example embodiment illustrates that the first through-hole 210 has a circular ring shape by way of example, but is not limited thereto.

FIGS. 4A to 4C schematically illustrate various example embodiments of the first through-hole 210. As illustrated in FIGS. 4A and 4B, a first through-hole 210a may have various forms of continuous ring structure, e.g., a quadrangular loop-shape structure, a hexagonal loop structure, and the like. As illustrated in FIG. 4C, a first through-hole 210b may have a structure in which a plurality of separate, discontinuous through-holes are arranged in a ring shape or annulus.

The first through-hole 210a or 210b may be filled with the first contact electrodes 140. When the passivation layer 200a is between the lower insulating layer 200 and the light emitting structure 100, as illustrated in the example embodiment, the first through-hole 210 may extend to the first conductivity-type semiconductor layer 110 while penetrating through the lower insulating layer 200 and the passivation layer 200a.

The lower insulating layer 200 may include a first lower insulating layer 201 and a second lower insulating layer 202 partitioned by the first through-hole 210. The first lower insulating layer 201 may be above the first conductivity-type semiconductor layer 110 in the etched region E, and may be surrounded by the first through-hole 210. In detail, the first lower insulating layer 201 may be surrounded by the first contact electrode 140 filling the first through-hole 210. In addition, the first lower insulating layer 201 may be surrounded by the second lower insulating layer 202 with the first through-hole 210, filled with the first contact electrode 140, interposed therebetween.

In other words, adjacent first regions, e.g., mesa regions M, in which the second conductivity-type semiconductor layer 130 is to be connected to the connection layer 300, may be spaced apart along a second direction, orthogonal to the third or stacking direction, by a second region E, in which the first conductivity-type semiconductor layer 110 is to be connected to the connection layer 300. The second region may include a first through-hole 210 that defines a central region that includes the first lower insulating layer 201, and portions of the stack that expose the first conductivity-type semiconductor layer 110.

The first lower insulating layer 201, together with the connection layer 300 described below, may implement an omnidirectional reflector (ODR) structure. The connection layer 300 may be on the lower insulating layer 200, and may be electrically connected to the first conductivity-type semiconductor layer 110 and the second conductivity-type semiconductor layer 130, through the first and second through-holes 210 and 220, respectively. For example, the connection layer 300 may be connected to the first contact electrode 140 and the second contact electrode 150 exposed through the first through-hole 210 and the second through-hole 220, to be connected to the first and second conductivity-type semiconductor layers 110 and 130, respectively.

The connection layer 300 may be provided as at least one pair for electrical isolation between the first and second conductivity-type semiconductor layers 110 and 130. For example, a first connection layer 310 may be electrically connected to the first conductivity-type semiconductor layer 110, and a second connection layer 320 may be electrically connected to the second conductivity-type semiconductor layer 130. The first and second connection layers 310 and 320 may be separated from each other to be electrically isolated from each other.

The connection layer 300 may be formed of a material including one or more of gold (Au), tungsten (W), platinum (Pt), silicon (Si), iridium (Ir), silver (Ag), aluminum (Al), copper (Cu), nickel (Ni), titanium (Ti), chromium (Cr), or the like, and alloys thereof. The example embodiment illustrates that the connection layer 300 has a single layer structure by way of example, but is not limited thereto. For example, the connection layer 300 may have a multilayer structure formed of different materials.

The upper insulating layer 400 may be disposed on the connection layer 300 to entirely cover and protect the connection layer 300. The upper insulating layer 400 may include a third through-hole 410 and a fourth through-hole 420 to partially expose the connection layer 300. For example, the third through-hole 410 may expose the first connection layer 310 and the fourth through-hole 420 may expose the second connection layer 320. The upper insulating layer 400 may be formed of a material substantially the same as that of the lower insulating layer 200.

The electrode pad 500 may be on the connection layer 300 exposed through the third and fourth through-holes 410 and 420. The electrode pad 500 may include a first electrode pad 510 and a second electrode pad 520. The first and second electrode pads 510 and 520 may be on the first and second connection layers 310 and 320 in the third and fourth through-holes 410 and 420, respectively. The first and second electrode pads 510 and 520 may be electrically connected to the first and second conductivity-type semiconductor layers 110 and 130 through the connection layer 300.

In order to implement a chip-on-board (COB)-type structure using a flip chip bonding method, the first and second electrode pads 510 and 520 may be disposed in the light emitting structure 100 in a single plane that may extend further in the stacking direction from other elements of the semiconductor light emitting device 10.

Figure 5:
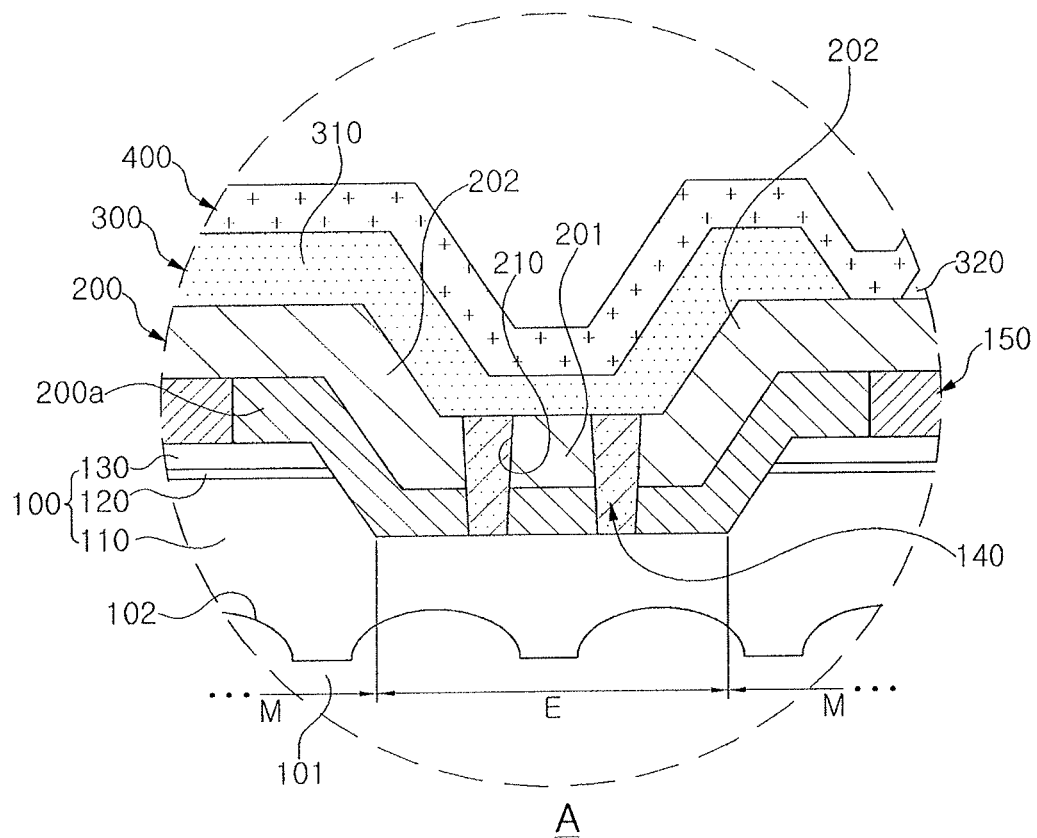
FIG. 5 illustrates an enlarged cross-sectional view of portion A of FIG. 2.

The ODR structure will be described below with reference to FIG. 5. FIG. 5 is an enlarged cross-sectional view of portion A of FIG. 2. As illustrated in FIG. 5, in the etched region E, the passivation layer 200a and the first lower insulating layer 201, as insulating dielectric layers, may be on a surface of the first conductivity-type semiconductor layer 110. The passivation layer 200a and the first lower insulating layer 201 may be covered with the first contact electrode 140 and the connection layer 300 formed of metal, respectively.

For example, in a manner different from the related art in which a first contact electrode entirely covers a surface of a first conductivity-type semiconductor layer 110; in the example embodiment, the first contact electrode 140 may have a ring-shaped structure to be in partial contact with a surface of the first conductivity-type semiconductor layer 110 in ring form, and in a vacant interior region of the ring-shape thereof, the passivation layer 200a and the first lower insulating layer 201 may be in contact with the surface of the first conductivity-type semiconductor layer 110. In addition, the connection layer 300 may be stacked on the first lower insulating layer 201, thereby implementing the ODR structure having a configuration in which a semiconductor layer, a dielectric layer, and a metal layer are stacked in a central portion of the etched region E.

The first contact electrode 140 connected to the first conductivity-type semiconductor layer 110 may reflect light, as a metal layer. However, electron vibration induced by incident light waves may cause absorption by electron-phonon scattering as well as causing reflection. Thus, reflection loss may be caused in a pure metal layer.

In the example embodiment, by implementing the ODR structure in which a connection range of the first contact electrode 140 to the first conductivity-type semiconductor layer 110 is limited to a portion of a ring shape thereof and the remaining region has relatively high reflectance, light extraction efficiency may be further improved as compared to the related art in which only a first contact electrode is on a first conductivity-type semiconductor layer 110.

Figure 6:
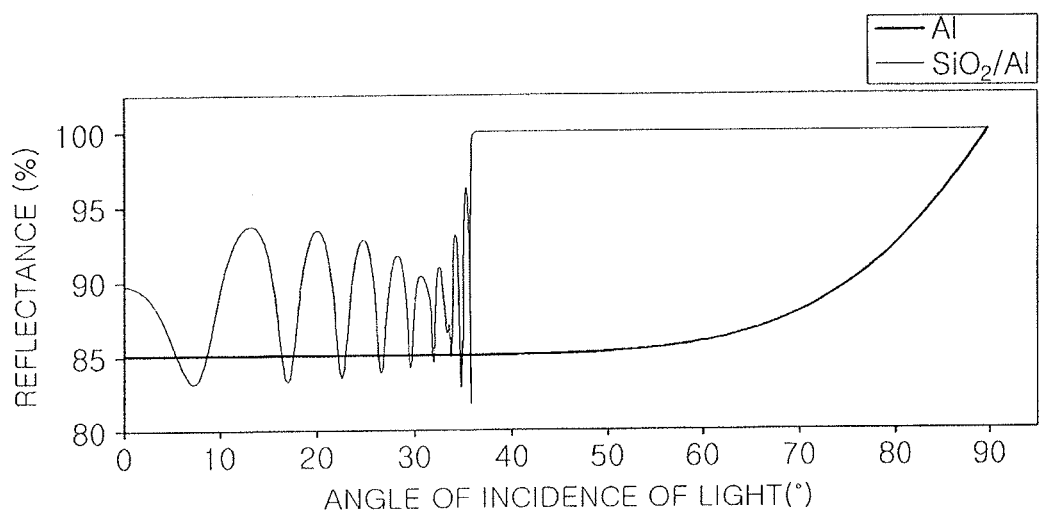
FIG. 6 illustrates a graph of reflectance of light in the case that an Al metal layer is on a semiconductor layer and the case that a $SiO_2$ dielectric layer is below the Al metal layer to be interposed between the Al metal layer and the semiconductor layer.

FIG. 6 is a graph illustrating reflectance of light when an aluminum (Al) metal layer is on a semiconductor layer and when a $SiO_2$ dielectric layer is below an Al metal layer, i.e., is between the Al metal layer and the semiconductor layer.

When only the Al metal layer is used, as in the related art, as an incident angle approximate to a vertical angle after about 60 degrees, reflectance is increased. However, in the ODR structure as in the example embodiment, the reflectance over all incident angles is relatively high. In particular, once the angle of incidence reaches 35 degrees, a reflectance of 100% is provided. Thus, in accordance with embodiments, reflection loss may be reduced or prevented compare with the related art and, thus, light extraction efficiency may be improved.

Figure 7A:
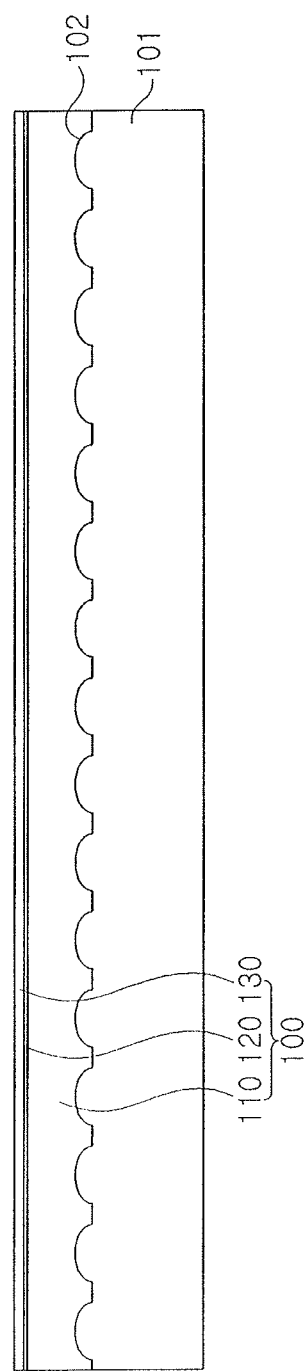
FIGS. 7A to 7F illustrate schematic views of stages in a method of manufacturing a semiconductor light emitting device according to an example embodiment.

FIGS. 7A to 7F illustrates schematic views of stages in a method of manufacturing a semiconductor light emitting device according to an example embodiment. In FIGS. 7A to 7F, the same reference numerals as FIG. 2 designate the same members, and overlapping descriptions thereof will be omitted. With reference to FIG. 7A, FIG. 7A illustrates a cross-sectional view taken along line I-I' of FIG. 1. FIGS. 7B to 7F below will be illustrated in the same manner.

First, concave-convex portions 102 may be formed on a substrate 101. However, according to an example embodiment, the concave-convex portions 102 may be omitted. The substrate 101 may be a material, e.g., sapphire, Si, SiC, $MgAl_2O_4$, MgO, $LiAlO_2$, $LiGaO_2$, GaN, AlN, and the like may be used. A buffer layer may be selectively provided on the substrate. The buffer layer may be formed of a material such as undoped GaN, AlN, InGaN, and the like.

Next, a light emitting structure 100 having a stacked structure in which a plurality of semiconductor layers are stacked may be formed, e.g., by allowing a first conductivity-type semiconductor layer 110, an active layer 120, and a second conductivity-type semiconductor layer 130 to be sequentially grown on the substrate 101, using a process, e.g., metal organic chemical vapor deposition (MOCVD), hydride vapor phase epitaxy (HVPE), molecular beam epitaxy (MBE), and the like. In this case, the first conductivity-type semiconductor layer 110 and the second conductivity-type semiconductor layer 130 may be an n-type semiconductor layer and a p-type semiconductor layer, respectively. Positions of the first conductivity-type semiconductor layer 110 and the second conductivity-type semiconductor layer 130 may be changed in the light emitting structure 100, such that they are disposed in positions opposite to each other. For example, the second conductivity-type semiconductor layer 130 may first be formed on the substrate 101 prior to the first conductivity-type semiconductor layer 110.

Figure 7B:
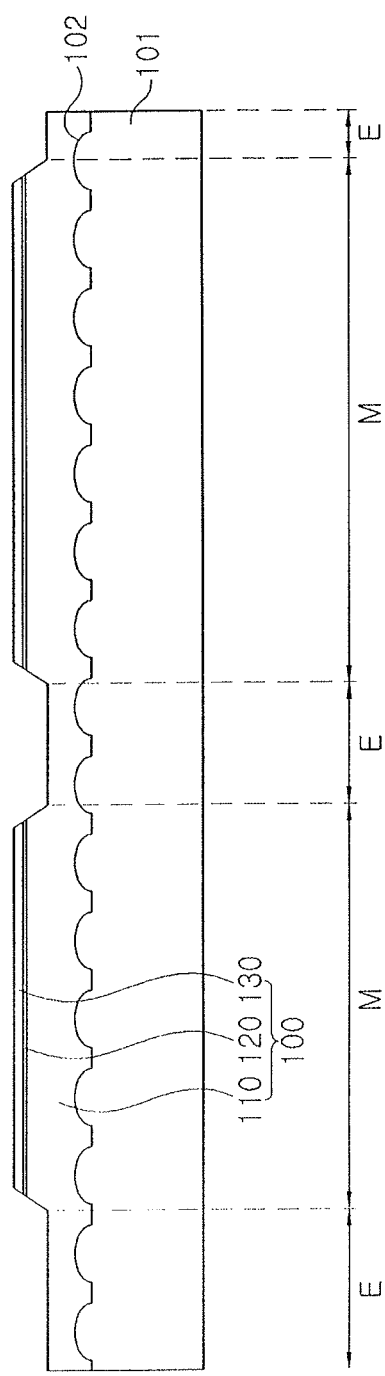

With reference to FIG. 7B, portions of the second conductivity-type semiconductor layer 130, the active layer 120, and the first conductivity-type semiconductor layer 110 may be removed, e.g., etched, to expose at least a portion of the first conductivity-type semiconductor layer 110. Thus, an etched region E and mesa regions M partitioned by the etched region E may be formed.

An etching process may be performed by forming a mask layer on a region other than the region in which the first conductivity-type semiconductor layer 110 is to be exposed, and then, performing a wet or dry etching process, to thus form the mesa regions M. According to an example embodiment, an etching process may also be performed to expose only a portion of an upper surface of the first conductivity-type semiconductor layer 110 to, without etching the first conductivity-type semiconductor layer 110, e.g., such that a trench is not formed in the first conductivity-type semiconductor layer 110, but an upper surface of the first conductivity-type semiconductor layer 110 is planar.

Figure 7C:
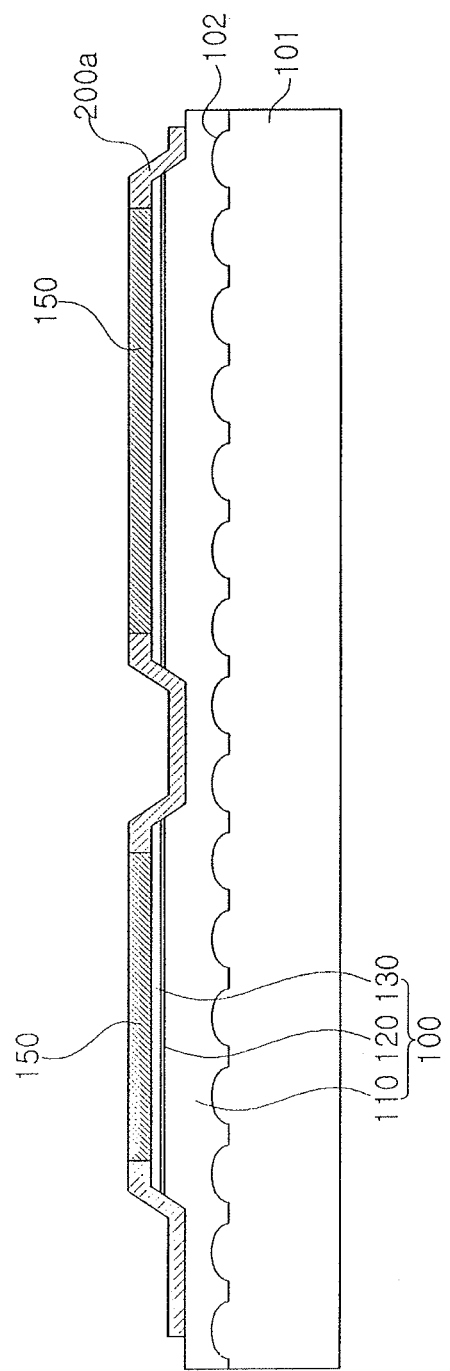

With reference to FIG. 7C, a passivation layer 200a may be formed on lateral surfaces of the mesa region M exposed to the etched region E using the etching process. The passivation layer 200a may be formed in such a manner that the lateral surfaces of the mesa region M as well as an edge of an upper surface of the mesa region M and a bottom surface of the etched region E are covered therewith. Thus, the active layer 120 exposed to the etched region E may be covered by the passivation layer 200a, to thus be prevented from being externally exposed. However, the passivation layer 200a may be selectively formed and may also be omitted according to an example embodiment.

Next, a second contact electrode 150 may be formed on the mesa region M. The second contact electrode 150 may be connected to the second conductivity-type semiconductor layer 130.

Figure 7D:
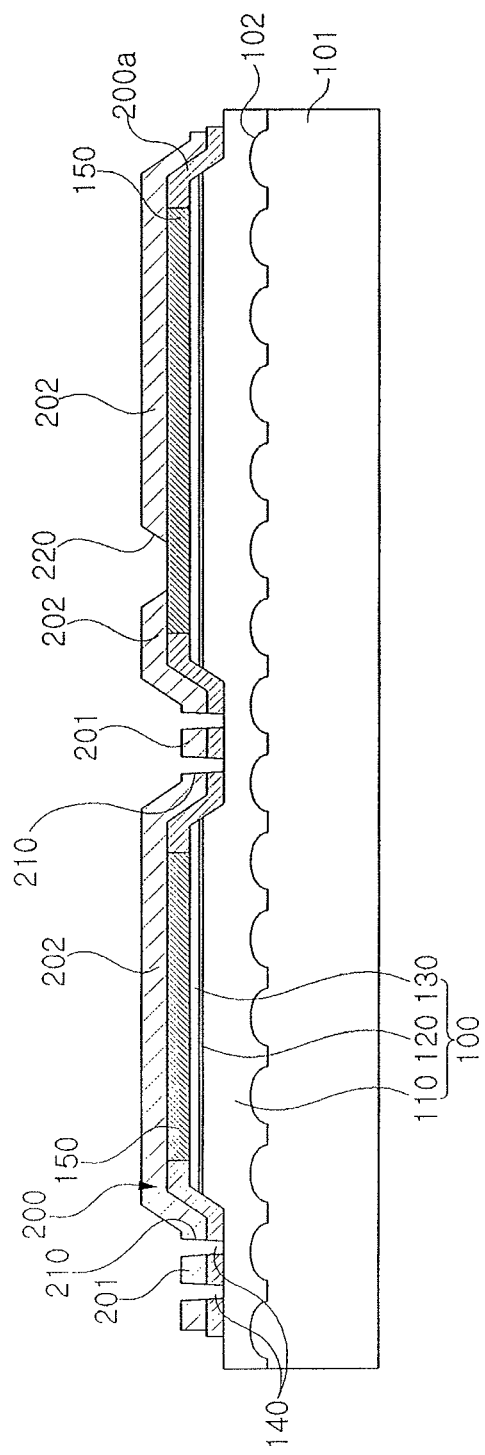

Referring to FIG. 7D, a lower insulating layer 200 may be formed on the light emitting structure 100 as a structure covering the light emitting structure 100. For example, the lower insulating layer 200 may be formed of an epoxy-based insulating resin. In addition, the lower insulating layer 200 may include silicon oxide or silicon nitride, and for example, may be formed of $SiO_2$, SiN, $SiO_xN_y$, $TiO_2$, $Si_3N_4$, $Al_2O_3$, TiN, AlN, $ZrO_2$, TiAlN, TiSiN, or the like.

Next, a first through-hole 210 and a second through-hole 220 may be formed by etching a portion of the lower insulating layer 200. The first through-hole 210 may be formed in the bottom of the etched region E. The first through-hole 210 may be formed by partially removing the lower insulating layer 200 and the passivation layer 200a from the bottom of the etched region E. The second through-hole 220 may be located above the second conductivity-type semiconductor layer 130.

The first through-hole 210 may partially expose the first conductivity-type semiconductor layer 110 in the etched region E. The second through-hole 220 may partially expose the second contact electrode 150 on the second conductivity-type semiconductor layer 130.

The first through-hole 210 may have a continuous ring-shaped structure, and may penetrate through the lower insulation layer 200 and the passivation layer 200a to be extended to the first conductivity-type semiconductor layer 110. The example embodiment illustrates that the first through-hole 210 has a circular ring shape by way of example, but is not limited thereto.

The lower insulating layer 200 may include the first lower insulating layer 201 within the first through-hole 210 and the second lower insulating layer 202 around and outside the first through-hole 210. The first lower insulating layer 201 may be disposed on the first conductivity-type semiconductor layer 110 within the etched region E, and may be separated from the second lower insulation layer 202 with the first through-hole 210 interposed therebetween.

Figure 7E:
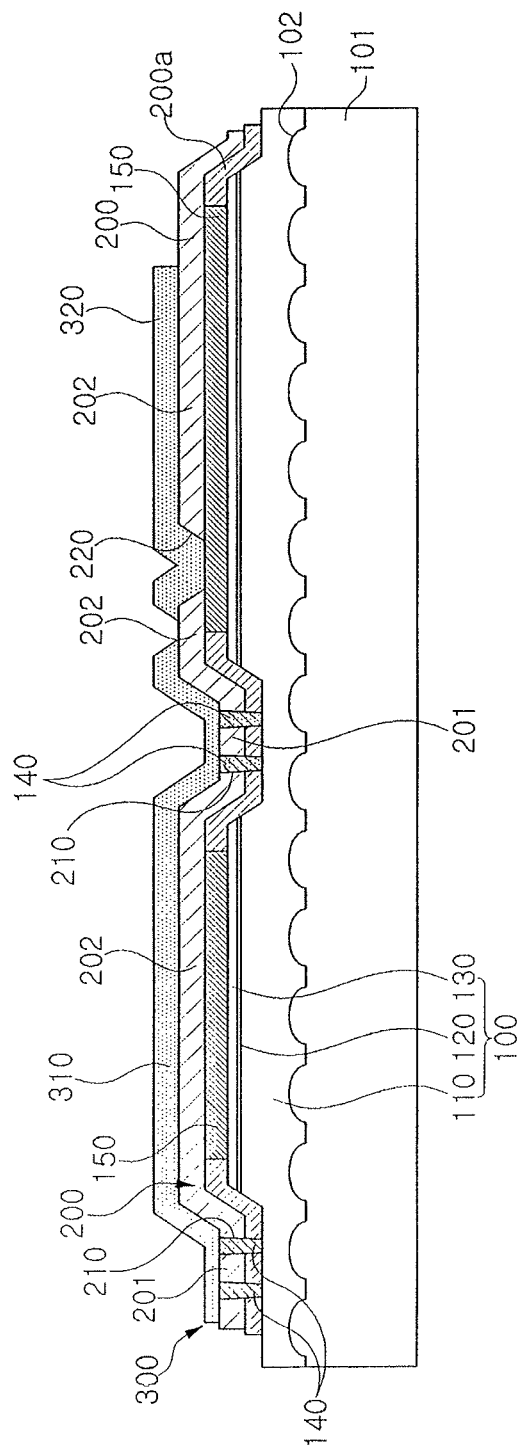

Referring to FIG. 7E, the first contact electrode 140 may be formed on the first conductivity-type semiconductor layer 110 exposed through the first through-hole 210. The first contact electrode 140 may be disposed in the first through-hole 210 to be connected to the first conductivity-type semiconductor layer 110. The first through-hole 210 may expose the first contact electrode 140.

Then, the connection layer 300 may be disposed on the lower insulating layer 200. The connection layer 300 may be connected to the first contact electrode 140 exposed through the first through-hole 210 and the second contact electrode 150 exposed through the second through-hole 220, to thus be electrically connected to the first and second conductivity-type semiconductor layers 110 and 130, respectively.

The connection layer 300 may include the first connection layer 310 and the second connection layer 320 separated from each other. The first connection layer 310 may be electrically connected to the first conductivity-type semiconductor layer 110, and the second connection layer 320 may be electrically connected to the second conductivity-type semiconductor layer 130.

Figure 7F:
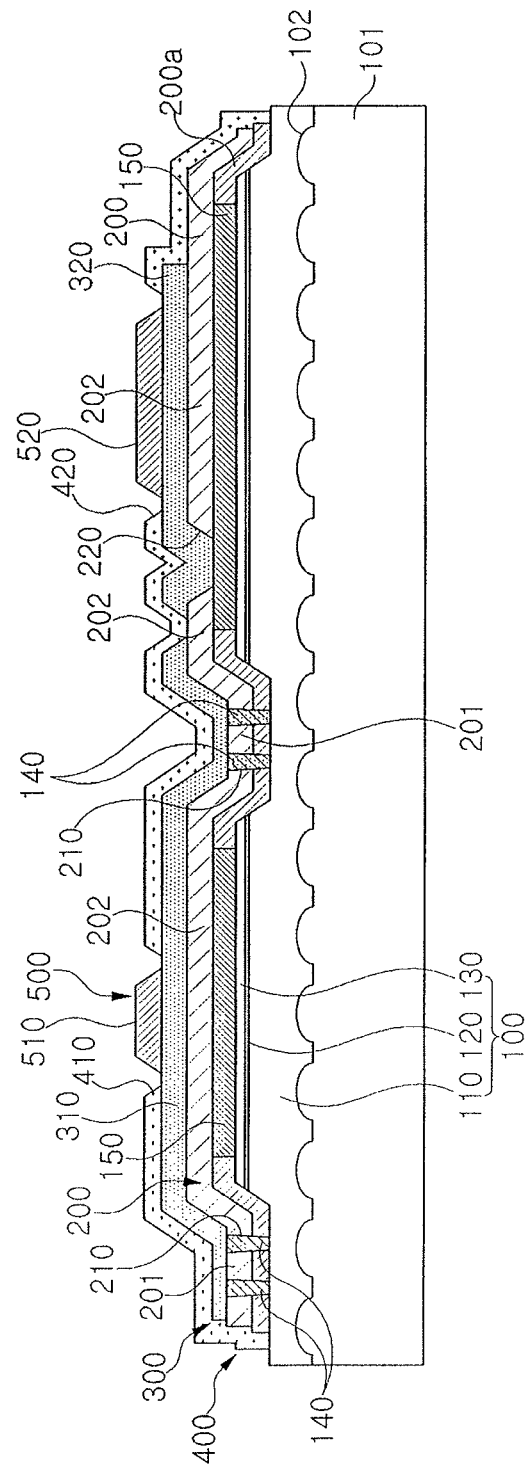

Referring to FIG. 7F, the upper insulating layer 400 may be formed on the connection layer 300. The upper insulating layer 400 may include third and fourth through-holes 410 and 420 to partially expose the connection layer 300. The third through-hole 410 may partially expose the first connection layer 310, and the fourth through-hole 420 may partially expose the second connection layer 320. The upper insulating layer 400 may be formed of the same material as that of the lower insulating layer 200.

Next, the electrode pad 500 may be formed on the first and second connection layers 310 and 320 partially exposed through the third and fourth through-holes 410 and 420. The electrode pad 500 may include the first electrode pad 510 and the second electrode pad 520.

Figure 8:
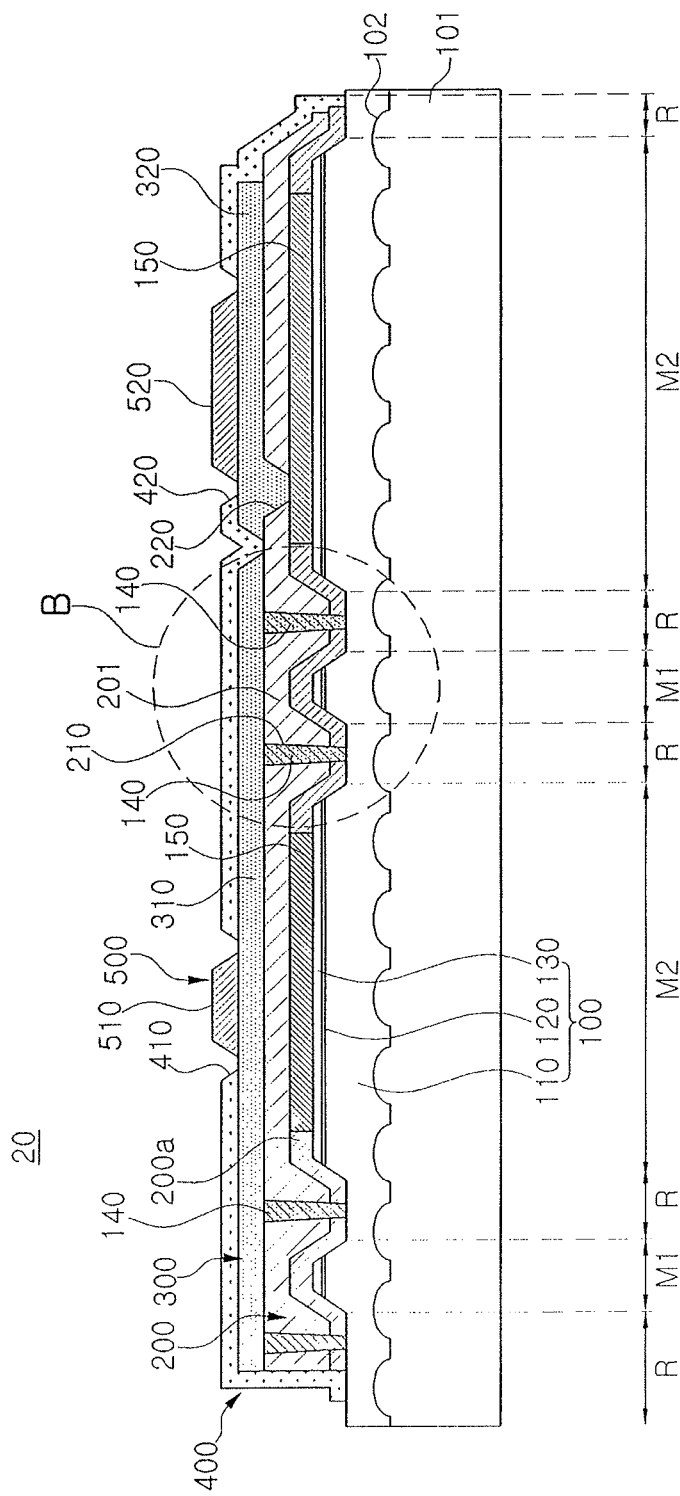
FIG. 8 illustrates a schematic cross-sectional view of a semiconductor light emitting device according to an example embodiment.
Figure 9A:
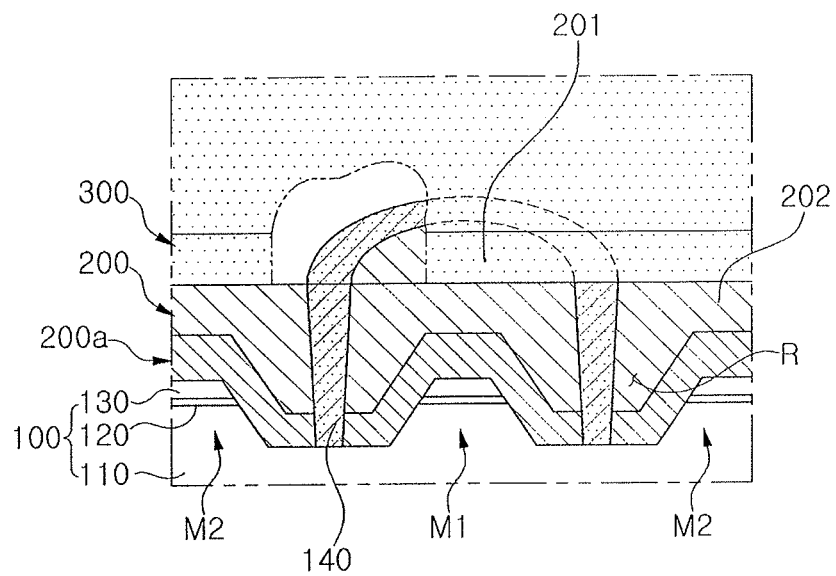
FIG. 9A illustrates a cutaway cross-sectional view schematically illustrating portion B of FIG. 8.
Figure 9B:
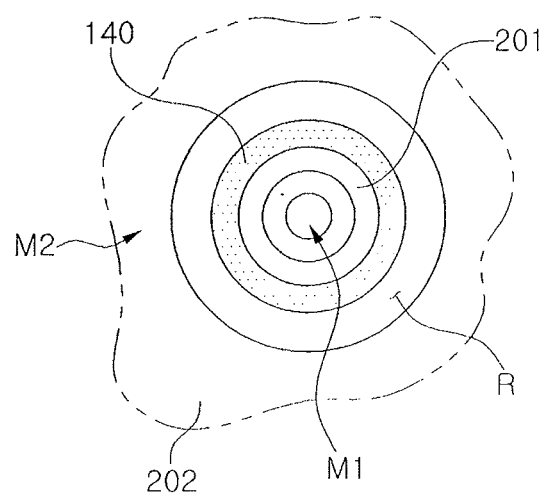
FIG. 9B illustrates a schematic plan view of FIG. 9A.

With reference to FIGS. 8 to 9, a semiconductor light emitting device according to an example embodiment will be described. FIG. 8 is a schematic cross-sectional view of a semiconductor light emitting device according to an example embodiment, FIG. 9A is a cutaway cross-sectional view schematically illustrating portion B of FIG. 8, and FIG. 9B is a schematic plan view of FIG. 9A. In FIGS. 8 to 9B, the same reference numerals as FIG. 2 designate the same members, and thus, a detailed description with respect to overlapping elements will be omitted.

With reference to FIGS. 8 to 9B, a semiconductor light emitting device 20 according to an example embodiment may include a light emitting structure 100, a lower insulating layer 200, a connection layer 300, an upper insulating layer 400, and a contact pad 500.

The light emitting structure 100 may have a structure in which a plurality of semiconductor layers are stacked, and may include a first conductivity-type semiconductor layer 110, an active layer 120, and a second conductivity-type semiconductor layer 130, sequentially stacked on a substrate 101.

The light emitting structure 100 may have a structure substantially corresponding to the light emitting structure 100 of FIG. 2. Thus, a detailed description of the light emitting structure 100 may be understood with reference to the foregoing embodiments described above, and a detailed description thereof will not be repeated.

The light emitting structure 100 may include mesa grooves R formed by etching portions of the second conductivity-type semiconductor layer 130, the active layer 120 and the first conductivity-type semiconductor layer 110. The light emitting structure 100 may include first mesa regions M1 and second mesa regions M2 partitioned by the mesa groove R.

As illustrated in 9A and 9B, the mesa groove R may have a ring-shaped structure surrounding the first mesa region M1. The example embodiment illustrates that the mesa groove R has a ring-shaped closed-curve structure by way of example, but is not limited thereto. For example, the mesa groove R may also have a ring-shaped open-curve structure. In addition, the ring-shaped structure is not limited to a circular ring shape as illustrated in the example embodiment, but may be provided to have various shapes, such as a quadrangular shape, or the like.

A first contact electrode 140 may be on a surface of the first conductivity-type semiconductor layer 110, exposed through the mesa groove R, to thus be connected to the first conductivity-type semiconductor layer 110, and a second contact electrode 150 may be disposed on a surface of the second conductivity-type semiconductor layer 130, to thus be connected to the second conductivity-type semiconductor layer 130.

A passivation layer 200a formed of an insulating material may be provided on lateral surfaces of the first mesa region M1 and the second mesa region M2 to cover the active layer 120 exposed to the mesa groove R.

As illustrated in FIGS. 8 and 9A, the passivation layer 200a may cover the first mesa region M and the mesa groove R. The passivation layer 200a may also be omitted.

The lower insulating layer 200 may be on the light emitting structure 100 as a structure entirely covering the light emitting structure 100, except for through-holes therein. The lower insulating layer 200 may be formed of a material having insulating properties, and may have a refractive index lower than that of the light emitting structure 100. The lower insulating layer 200 may include a first through-hole 210 disposed on the first conductivity-type semiconductor layer 110 exposed to the mesa groove R, and a second through-hole 220 on the second conductivity-type semiconductor layer 130.

The first through-hole 210 may be located in a bottom of the mesa groove R. The first through-hole 210 may be formed by partially removing the lower insulating layer 200 from the bottom of the mesa groove R.

The first contact electrode 140 connected to the first conductivity-type semiconductor layer 110 in the mesa groove R may be disposed in the first through-hole 210. The first through-hole 210 may expose the first contact electrode 140.

The second through-hole 220 may allow the second contact electrode 150 connected to the second conductivity-type semiconductor layer 130 while being provided on the second conductivity-type semiconductor layer 130, to be partially exposed.

The first through-hole 210 may have a ring-shaped structure extended along a circumference of the first mesa region M1 in the mesa groove R. The example embodiment illustrates that the first through-hole 210 has a circular ring shape by way of example, but is not limited thereto.

The lower insulating layer 200 may include a first lower insulating layer 201 disposed in the first mesa region M1, and a second lower insulating layer 202 disposed in the second mesa region M2.

The first lower insulating layer 201 may be disposed on the first mesa region M1 in the mesa groove R, and may be separated from the second lower insulation layer 202 with the mesa groove R interposed therebetween.

The connection layer 300 may be on the lower insulating layer 200, and may be electrically connected to the first conductivity-type semiconductor layer 110 and the second conductivity-type semiconductor layer 130, through the first and second through-holes 210 and 220, respectively. For example, the connection layer 300 may be connected to the first contact electrode 140 and the second contact electrode 150 exposed through the first through-hole 210 and the second through-hole 220, to be connected to the first and second conductivity-type semiconductor layers 110 and 130, respectively.

The connection layer 300 may be provided as at least one pair for electrical isolation between the first conductivity-type semiconductor layer 110 and the second conductivity-type semiconductor layer 130. For example, the first connection layer 310 may be electrically connected to the first conductivity-type semiconductor layer 110, and a second connection layer 320 may be electrically connected to the second conductivity-type semiconductor layer 130. The first and second connection layers 310 and 320 may be separated from each other to be electrically isolated from each other.

In other words, adjacent first regions, e.g., second mesa regions M2, in which the second conductivity-type semiconductor layer 130 is to be connected to the connection layer 300, may be spaced apart along a second direction, orthogonal to the third or stacking direction, by a second region R, M1, R, in which the first conductivity-type semiconductor layer 110 is to be connected to the connection layer 300. The second region may include a first through-hole 210 that defines a central region that includes the first mesa region M1 and the first lower insulating layer 201, as well as portions of the stack that expose the first conductivity-type semiconductor layer 110.

In the example embodiment, the ODR structure may be implemented by a stacked structure in which a first mesa region M1 surrounded by the first contact electrode 140 in an inside region of the mesa groove R, the first lower insulating layer 201, and the connection layer 300 are stacked.

The upper insulating layer 400 may be on the connection layer 300 and may entirely cover and protect the connection layer 300. The upper insulating layer 400 may include the third through-hole 410 and the fourth through-hole 420 that partially expose the connection layer 300.

The electrode pad 500 may be on the connection layer 300 exposed through the third and fourth through-holes 410 and 420. The electrode pad 500 may include the first electrode pad 510 and a second electrode pad 520.

Figure 10A:
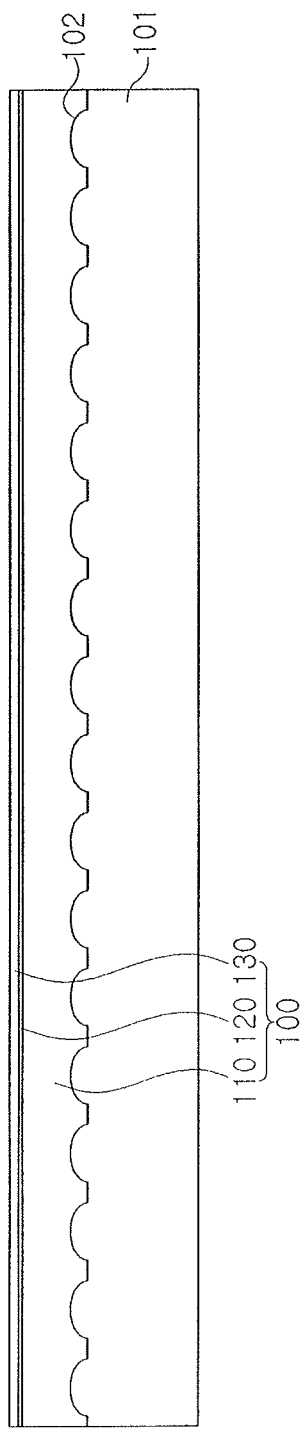
FIGS. 10A to 10F illustrate schematic views of stages in a method of manufacturing a semiconductor light emitting device according to an example embodiment.

With reference to FIGS. 10A to 10F, a method of manufacturing a semiconductor light emitting device according to an example embodiment will be described below. FIGS. 10A to 10F are schematic views of stages in a method of manufacturing a semiconductor light emitting device according to an example embodiment. In FIGS. 10A to 10F, the same reference numerals as FIG. 8 designate the same members, and overlapping descriptions thereof will be omitted. With reference to FIG. 10A, FIG. 10A illustrates a cross-sectional view taken along line I-I' of FIG. 1. FIGS. 10B to 10F below will be illustrated in the same manner.

First, concave-convex portions 102 may be formed on a substrate 101. According to an example embodiment, the concave-convex portions 102 may be omitted. The substrate 101 may be a material, e.g., sapphire, Si, SiC, $MgAl_2O_4$, MgO, $LiAlO_2$, $LiGaO_2$, GaN, AlN, and the like may be used. A buffer layer may be selectively provided on the substrate 101.

Next, a light emitting structure 100 having a stacked structure in which a plurality of semiconductor layers are stacked may be formed by sequentially growing a first conductivity-type semiconductor layer 110, an active layer 120, and a second conductivity-type semiconductor layer 130 on the substrate 101. In this case, the first conductivity-type semiconductor layer 110 and the second conductivity-type semiconductor layer 130 may be an n-type semiconductor layer and a p-type semiconductor layer 130, respectively.

Figure 10B:
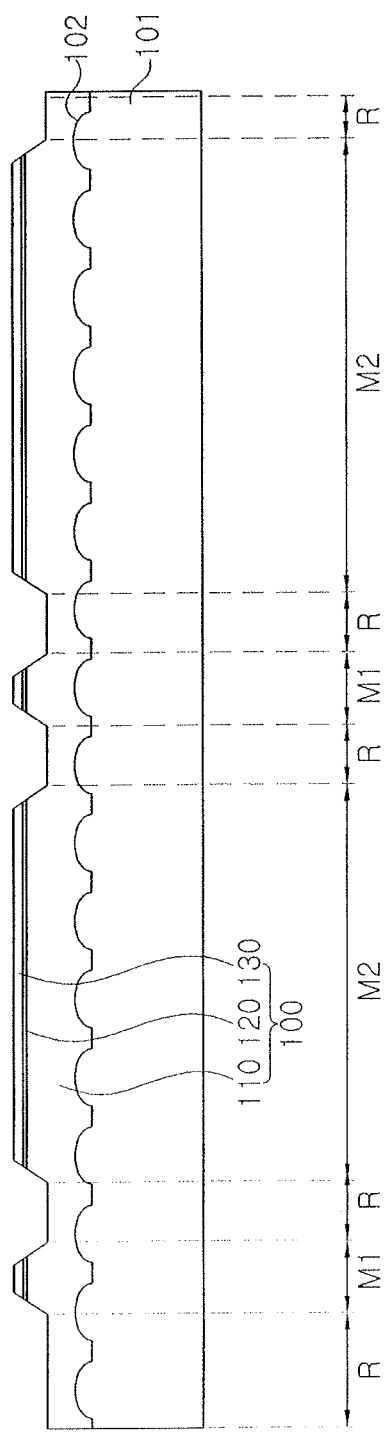

With reference to FIG. 10B, portions of the second conductivity-type semiconductor layer 130, the active layer 120, and the first conductivity-type semiconductor layer 110 may be etched to expose at least a portion of the first conductivity-type semiconductor layer 110, thereby forming a mesa groove R. Thus, the light emitting structure 100 may include a first mesa region M1 and a second mesa region M2 partitioned by the mesa groove R.

An etching process may be performed by forming a mask layer on a region except for the region in which the first conductivity-type semiconductor layer 110 is to be exposed, and then, performing a wet or dry etching process, thereby forming the mesa groove R.

The mesa groove R may be formed in a ring-shaped structure surrounding the first mesa region M1. The example embodiment illustrates that the mesa groove R has a ring-shaped closed-curve structure by way of example, but is not limited thereto. For example, the mesa groove R may have various shapes such as a quadrangular shape and the like.

Figure 10C:
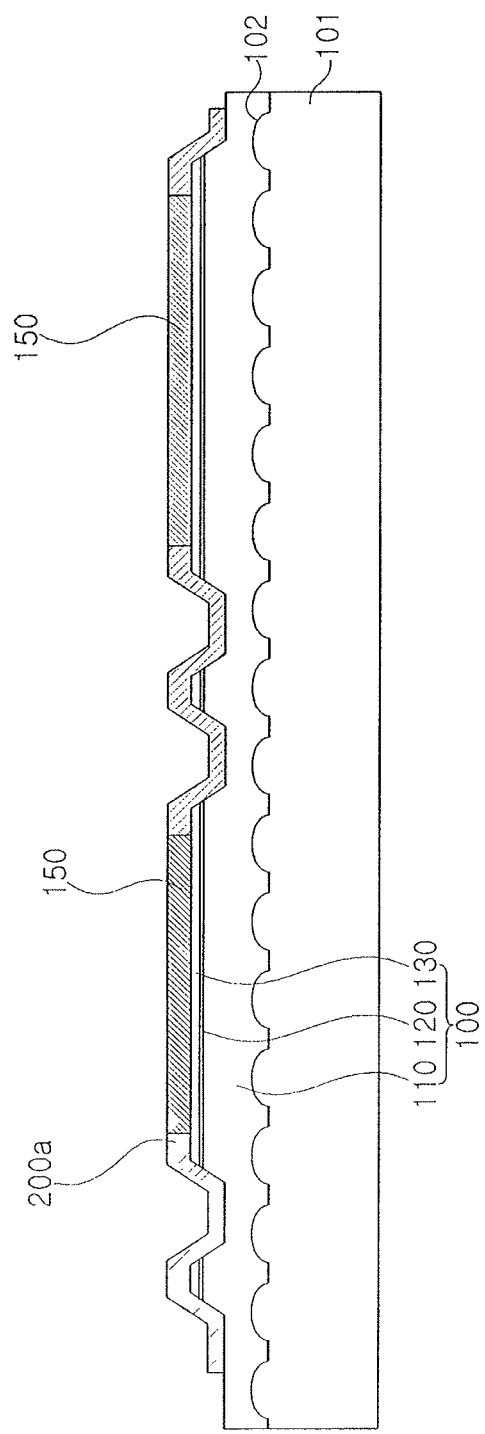

Referring to FIG. 10C, a passivation layer 200a may be formed on lateral surfaces of the first and second mesa regions M1 and M2 exposed through the mesa groove R via an etching process. The passivation layer 200a may be formed as a structure covering the first mesa region M1 and a surface of the mesa groove R. Thus, the active layer 120 exposed through the mesa groove R may be covered by the passivation layer 200a, to be prevented from being exposed externally. The passivation layer 200a may be selectively formed, and thus, may also be omitted according to an example embodiment.

Next, a second contact electrode 150 may be formed on the mesa region M2. The second contact electrode 150 may be connected to the second conductivity-type semiconductor layer 130.

Figure 10D:
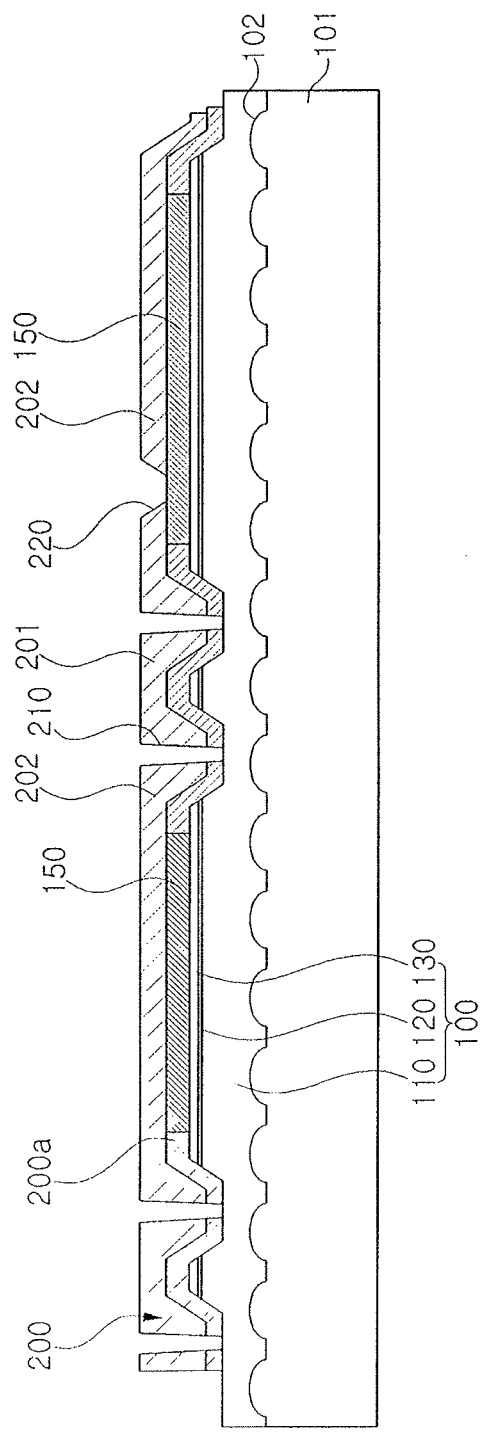

Referring to FIG. 10D, a lower insulating layer 200 may be formed on the light emitting structure 100 as a structure entirely covering the light emitting structure 100.

Next, a first through-hole 210 and a second through-hole 220 may be formed by etching a portion of the lower insulating layer 200. The first through-hole 210 may be located in a bottom of the mesa groove R. The first through-hole 210 may be formed by partially removing the lower insulating layer 200 and the passivation layer 200a from the bottom of the mesa groove R. The second through-hole 220 may be located on the second conductivity-type semiconductor layer 130.

The first through-hole 210 may partially expose the first conductivity-type semiconductor layer 110 in the mesa groove R. The second through-hole 220 may partially expose the second contact electrode 150 on the second conductivity-type semiconductor layer 130.

The first through-hole 210 may have a ring-shaped structure extended along a circumference of the first mesa region M1 in the mesa groove R. In addition, the first through-hole 210 may penetrate through the lower insulating layer 200 and the passivation layer 200a, to be extended to the first conductivity-type semiconductor layer 110. The example embodiment illustrates that the first through-hole 210 has a circular ring-shaped structure by way of example, but is not limited thereto.

The lower insulating layer 200 may include a first lower insulating layer 201 and a second lower insulating layer 202 partitioned by the first through-hole 210. The first lower insulating layer 201 may be disposed in the first mesa region M, and the second lower insulating layer 202 may be disposed in the second mesa region M2. The first lower insulating layer 201 may cover the first mesa region M1 in the mesa groove R, and may be separated from the second lower insulation layer 202 with the mesa groove R interposed therebetween.

Figure 10E:
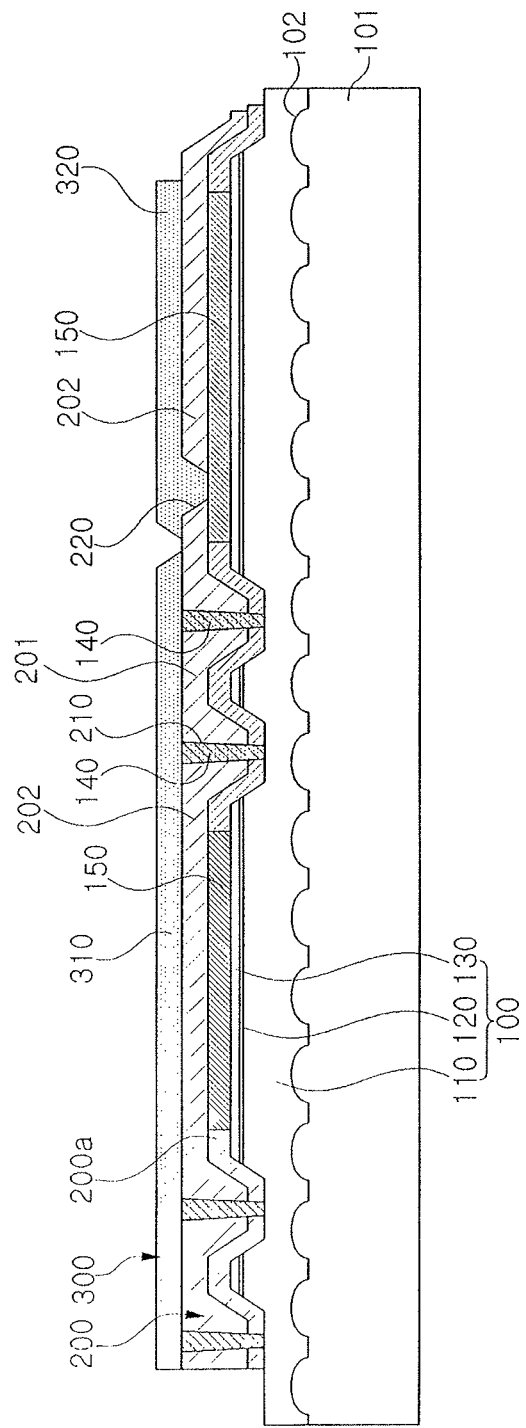

Referring to FIG. 10E, the first contact electrode 140 may be formed on the first conductivity-type semiconductor layer 110 exposed through the first through-hole 210. The first contact electrode 140 may be disposed in the first through-hole 210 to be connected to the first conductivity-type semiconductor layer 110. The first through-hole 210 may expose the first contact electrode 140.

Then, a connection layer 300 may be disposed on the lower insulating layer 200. The connection layer 300 may be connected to the first contact electrode 140 exposed through the first through-hole 210 and the second contact electrode 150 exposed through the second through-hole 210, to thus be electrically connected to the first and second conductivity-type semiconductor layers 110 and 130, respectively.

The connection layer 300 may include a first connection layer 310 and a second connection layer 320 separated from each other. The first connection layer 310 may be electrically connected to the first conductivity-type semiconductor layer 110, and the second connection layer 320 may be electrically connected to the second conductivity-type semiconductor layer 130.

Figure 10F:
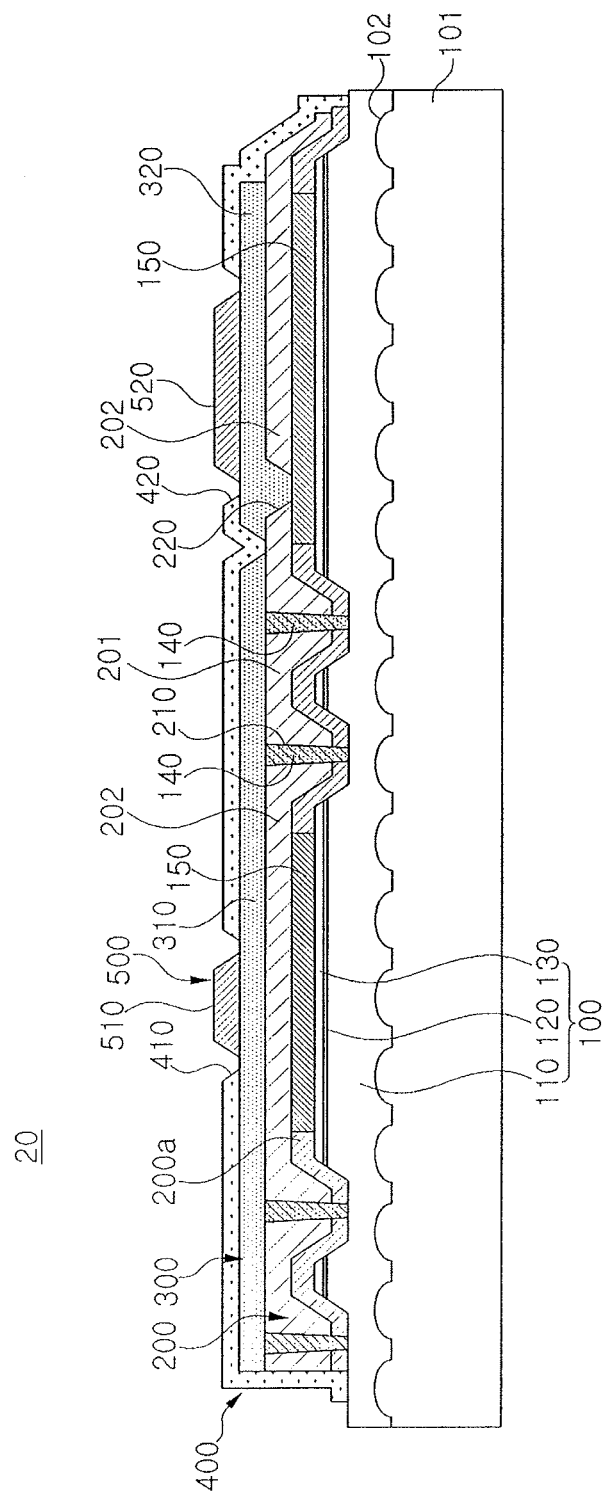

Referring to FIG. 10F, an upper insulating layer 400 may be formed on the connection layer 300. The upper insulating layer 400 may include third and fourth through-holes 410 and 420 to partially expose the connection layer 300. The third through-hole 410 may partially expose the first connection layer 310 and the fourth through-hole 420 may partially expose the second connection layer. The upper insulating layer 400 may be formed of the same material as that of the lower insulating layer 200.

Next, an electrode pad 500 may be formed on the first and second connection layers 310 and 320 partially exposed through the third and fourth through-holes 410 and 420. The electrode pad 500 may include a first electrode pad 510 and a second electrode pad 520.

By way of summation and review, one or more embodiments may provide a semiconductor light emitting device in which light extraction efficiency may be improved while preventing light loss.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor light emitting device, comprising:
a light emitting structure including a first conductivity-type semiconductor layer, an active layer, and a second conductivity-type semiconductor layer stacked in a stacking direction;
a lower insulating layer on the light emitting structure and including a first through-hole on the first conductivity-type semiconductor layer and a second through-hole on the second conductivity-type semiconductor layer;

a connection layer on the lower insulating layer, and electrically connected to the first conductivity-type semiconductor layer and the second conductivity-type semiconductor layer through the first and second through-holes, respectively; and an upper insulating layer on the connection layer and including a third through-hole and a fourth through-hole that partially expose the connection layer, wherein the lower insulating layer includes a first lower insulating layer and a second lower insulating layer partitioned by the first through-hole, and the first lower insulating layer is on the first conductivity-type semiconductor layer and is surrounded by the second lower insulating layer with the first through-hole interposed between the first and second lower insulating layers.

2. The semiconductor light emitting device as claimed in claim 1, wherein:

the light emitting structure includes a first region including the second conductivity-type semiconductor layer, the active layer, and the first conductivity-type semiconductor layer, and a second region, between adjacent first regions along a second direction orthogonal to the stacking direction, that exposes the first conductivity-type semiconductor layer, wherein the first lower insulating layer is located on a bottom of the second region.

3. The semiconductor light emitting device as claimed in claim 1, wherein the lower insulating layer has a refractive index lower than a refractive index of the light emitting structure.

4. The semiconductor light emitting device as claimed in claim 1, wherein the first through-hole has a continuous ring-shaped structure, and penetrates through the lower insulating layer to expose the first conductivity-type semiconductor layer.

5. The semiconductor light emitting device as claimed in claim 1, wherein the first through-hole has a structure in which a plurality of through-holes are arranged in a ring shape, and penetrates the lower insulating layer to be extended to the first conductivity-type semiconductor layer.

6. The semiconductor light emitting device as claimed in claim 1, further comprising a passivation layer between the lower insulating layer and the light emitting structure, wherein the first through-hole penetrates through the lower insulating layer and the passivation layer, to expose to the first conductivity-type semiconductor layer.

7. The semiconductor light emitting device as claimed in claim 1, further comprising a first contact electrode in the first through-hole to be connected to the first conductivity-type semiconductor layer, and a second contact electrode on the second conductivity-type semiconductor layer to be connected to the second conductivity-type semiconductor layer.

8. The semiconductor light emitting device as claimed in claim 1, further comprising a first electrode pad and a second electrode pad on the connection layer in the third and fourth through-holes.

9. A semiconductor light emitting device, comprising:

a light emitting structure including first regions having a first conductivity-type semiconductor layer, an active layer, and a second conductivity-type semiconductor layer stacked on a substrate in a stacking direction, and second regions that expose the first conductivity-type semiconductor layer, adjacent first regions being spaced apart along a second direction, orthogonal to the stacking direction, by a second region; and an insulating layer on the light emitting structure and including a first through-hole overlapping the first conductivity-type semiconductor layer in the stacking direction in the second region to expose the first conductivity-type semiconductor layer and a second through-hole overlapping the second conductivity-type semiconductor layer in the stacking direction in the first region, wherein the first through-hole surrounds a central region in the first region having the insulating layer therein.

10. The semiconductor light emitting device as claimed in claim 9, wherein:

the central region includes a third region having the first conductivity-type semiconductor layer, the active layer, and the second conductivity-type semiconductor layer stacked on the substrate in the stacking direction, and the first through-hole surrounds the third region such that the first conductivity-type semiconductor layer is exposed on opposite sides of the third region along the second direction.

11. The semiconductor light emitting device as claimed in claim 10, wherein the first through-hole extends along a circumference of the central region.

12. The semiconductor light emitting device as claimed in claim 9, wherein a height of the first conductivity-type semiconductor layer along the stacking direction where the first through-hole is located is higher than in the second region.

13. The semiconductor light emitting device as claimed in claim 9, further comprising a first contact electrode in the first through-hole to be connected to the first conductivity-type semiconductor layer, and a second contact electrode on the second conductivity-type semiconductor layer to be connected to the second conductivity-type semiconductor layer.

14. The semiconductor light emitting device as claimed in claim 9, further comprising a passivation layer between the insulating layer and the light emitting structure.

15. The semiconductor light emitting device as claimed in claim 9, wherein the substrate includes a plurality of concave-convex portions on a surface thereof.

16. A semiconductor light emitting device, comprising:

a light emitting structure including first regions having a first conductivity-type semiconductor layer, an active layer, and a second conductivity-type semiconductor layer stacked on a substrate in a stacking direction, and second regions that expose the first conductivity-type semiconductor layer, adjacent first regions being spaced apart along a second direction, orthogonal to the stacking direction, by a second region; and an insulating layer on the light emitting structure and including a first through-hole overlapping the first conductivity-type semiconductor layer in the stacking direction in the second region to expose the first conductivity type semiconductor layer and a second through-hole overlapping the second conductivity-type semiconductor layer in the stacking direction in the first region, wherein the first through-hole surrounds an insulating region having the insulating layer therein within the second region.

17. The semiconductor light emitting device as claimed in claim 16, wherein the first through-hole continuously surrounds the insulating region.

18. The semiconductor light emitting device as claimed in claim 16, wherein the first through-hole discontinuously surrounds the insulating region.

19. The semiconductor light emitting device as claimed in claim 16, wherein:

the insulating region includes a third region having the first conductivity-type semiconductor layer, the active layer, and the second conductivity-type semiconductor layer stacked on the substrate in the stacking direction, and the first through-hole surrounds the third region such that the first conductivity-type semiconductor layer is exposed on opposite sides of the third region along the second direction.

20. The semiconductor light emitting device as claimed in claim 16, wherein a height of the first conductivity-type semiconductor layer along the stacking direction in the first region is higher than in the second region.

\* \* \* \* \*